(12) United States Patent
Lie et al.

(10) Patent No.: US 11,699,591 B2
(45) Date of Patent: Jul. 11, 2023

(54) TWO-COLOR SELF-ALIGNED DOUBLE PATTERNING (SADP) TO YIELD STATIC RANDOM ACCESS MEMORY (SRAM) AND DENSE LOGIC

(71) Applicant: Tessera LLC, San Jose, CA (US)

(72) Inventors: Fee Li Lie, Albany, NY (US); Dongbing Shao, Wappingers Falls, NY (US); Robert C. Wong, Poughkeepsie, NY (US); Yongan Xu, Albany, NY (US)

(73) Assignee: Tessera LLC, San Jose, CA (US)

( * ) Notice: Subject to any disclaimer, the term of this patent is extended or adjusted under 35 U.S.C. 154(b) by 221 days.

(21) Appl. No.: 17/360,819

(22) Filed: Jun. 28, 2021

(65) Prior Publication Data

US 2021/0343536 A1    Nov. 4, 2021

Related U.S. Application Data

(63) Continuation of application No. 16/796,614, filed on Feb. 20, 2020, now Pat. No. 11,062,911, which is a
(Continued)

(51) Int. Cl.
*H01L 21/308* (2006.01)
*H01L 21/033* (2006.01)
(Continued)

(52) U.S. Cl.
CPC ...... *H01L 21/3086* (2013.01); *H01L 21/0332* (2013.01); *H01L 21/0335* (2013.01);
(Continued)

(58) Field of Classification Search
None
See application file for complete search history.

(56) References Cited

U.S. PATENT DOCUMENTS

| 6,875,703 B1 | 4/2005 | Furukawa et al. |
| 7,763,531 B2 | 7/2010 | Abadeer et al. |
| (Continued) | | |

OTHER PUBLICATIONS

Abercrombie, David, Nov. 17, 2014, "Fill/Cut Self-Aligned Double Patterning," Part One, pp. 1-11, https://semiengineering.com/fillcut-self-aligned-double-patterning/.
(Continued)

*Primary Examiner* — Roberts P Culbert
(74) *Attorney, Agent, or Firm* — Haley Guiliano LLP

(57) ABSTRACT

First lithography and etching are carried out on a semiconductor structure to provide a first intermediate semiconductor structure having a first set of surface features corresponding to a first portion of desired fin formation mandrels. Second lithography and etching are carried out on the first intermediate structure, using a second mask, to provide a second intermediate semiconductor structure having a second set of surface features corresponding to a second portion of the mandrels. The second set of surface features are unequally spaced from the first set of surface features and/or the features have different pitch. The fin formation mandrels are formed in the second intermediate semiconductor structure using the first and second sets of surface features; spacer material is deposited over the mandrels and is etched back to form a third intermediate semiconductor structure having a fin pattern. Etching is carried out on same to produce the fin pattern.

20 Claims, 12 Drawing Sheets

Related U.S. Application Data continuation of application No. 15/842,841, filed on Dec. 14, 2017, now Pat. No. 10,573,528.

(51) Int. Cl.
  *H01L 21/311* (2006.01)
  *H01L 21/3065* (2006.01)
  *H01L 21/8234* (2006.01)
  *H01L 29/66* (2006.01)
  *H01L 27/088* (2006.01)
  *H01L 29/78* (2006.01)
  *H10B 10/00* (2023.01)

(52) U.S. Cl.
  CPC ...... *H01L 21/0337* (2013.01); *H01L 21/3065* (2013.01); *H01L 21/3081* (2013.01); *H01L 21/3085* (2013.01); *H01L 21/31116* (2013.01); *H01L 21/823431* (2013.01); *H01L 27/0886* (2013.01); *H01L 29/6681* (2013.01); *H01L 29/66795* (2013.01); *H01L 29/785* (2013.01); *H10B 10/12* (2023.02); *H10B 10/18* (2023.02)

(56) References Cited

U.S. PATENT DOCUMENTS

| | | | |
|---|---|---|---|
| 8,680,671 | B2 | 3/2014 | Hsieh |
| 8,799,844 | B2 | 8/2014 | Cho et al. |
| 9,029,263 | B1 | 5/2015 | Kim et al. |
| 9,105,478 | B2 | 8/2015 | Wei et al. |
| 9,305,845 | B2 | 4/2016 | Colburn et al. |
| 9,472,447 | B1 | 10/2016 | Kanakasabapathy et al. |
| 9,524,909 | B2 | 12/2016 | Huang et al. |
| 9,536,596 | B2 | 1/2017 | Mojumder et al. |
| 9,564,446 | B1 * | 2/2017 | Weybright ...... H01L 21/823431 |
| 9,673,055 | B2 | 6/2017 | Anderson et al. |
| 9,691,775 | B1 | 6/2017 | Licausi et al. |
| 9,905,464 | B2 | 2/2018 | Hung et al. |
| 9,991,131 | B1 | 6/2018 | Sung et al. |
| 2006/0154426 | A1 | 7/2006 | Anderson et al. |
| 2006/0273456 | A1 | 12/2006 | Sant et al. |
| 2008/0057692 | A1 | 3/2008 | Wells et al. |
| 2014/0110817 | A1 | 4/2014 | Bergendahl et al. |
| 2015/0147887 | A1 | 5/2015 | Liu et al. |
| 2016/0225634 | A1 | 8/2016 | Anderson et al. |
| 2018/0174894 | A1 | 6/2018 | Bouche et al. |
| 2018/0315602 | A1 | 11/2018 | Tseng et al. |
| 2020/0266072 | A1 | 8/2020 | Lie et al. |

OTHER PUBLICATIONS

W. Kang, et al., "Mask Strategy and Layout Decomposition for Self-Aligned Quadruple Patterning," Proc. SPIE, vol. 8684, 2013, 86840E, 13 pages.

Wikipedia, "Multiple Patterning," downloaded Nov. 13, 2017 from https://en.wikipedia.org/wiki/Multiple_patterning, pp. 1-18.

Office Action for U.S. Appl. No. 16/796,614, dated Nov. 27, 2020, Lie, "Two-Color Self-Aligned Double Patterning (SADP) to Yield Static Random Access Memory (SRAM) and Dense Logic", 6 pages.

R. Aitken, et al., "Physical Design and FinFETs," International Symposium on Physical Design, 2014, pp. 65-68.

S. Banna, "Scaling Challenges of FinFET Technology at Advanced Nodes and its Impact on SoC Design," Custom Integrated Circuits Conference, CICC, 2015, 8 pages.

Abercrombie, David, May 15, 2014, "Self-Aligned Double Patterning," Part One, pp. 1-6, https://semiengineering.com/self-aligned-double-patterning-part-one/.

* cited by examiner

TWO-COLOR SELF-ALIGNED DOUBLE PATTERNING (SADP) TO YIELD STATIC RANDOM ACCESS MEMORY (SRAM) AND DENSE LOGIC

CROSS-REFERENCE TO RELATED APPLICATION(S)

This application is a continuation of and claims priority to U.S. patent application Ser. No. 16/796,614, filed Feb. 20, 2020, which is a continuation of and claims priority to U.S. patent application Ser. No. 15/842,841, filed Dec. 14, 2017, now U.S. Pat. No. 10,573,528 issued Feb. 25, 2020, the entirety of which are hereby incorporated by reference herein for all purposes.

BACKGROUND

The present invention relates to the electrical and electronic arts, and more specifically, to semiconductor fabrication techniques and the like.

For quite some time, continued reduction in the size of metal oxide semiconductor field effect transistors (MOSFETs) has driven progress in the semiconductor industry. Despite predictions of barriers to continued progress, improvements in accordance with Moore's Law have continued apace. However, there are growing signs today that metal oxide semiconductor transistors are beginning to reach their traditional scaling limits. Since it has become increasingly difficult to improve MOSFETs (and therefore complementary metal oxide semiconductor (CMOS) performance) through continued scaling, further methods for improving performance, in addition to scaling, have become important.

One approach is the use of non-planar semiconductor devices such as, for example, semiconductor fin field effect transistors (FinFETs). FinFETs are non-planar semiconductor devices which include at least one semiconductor fin protruding from a surface of a substrate; they can increase the ON-current per unit area relative to planar field effect transistors.

Semiconductor fins are typically formed utilizing a sidewall image transfer (SIT) process, since the same provides sub-lithographic line widths. In a typical SIT process, spacers are formed on each sidewall surface of a sacrificial mandrel that is formed on a topmost semiconductor material of a substrate. The sacrificial mandrel is removed and the remaining spacers are used as an etch mask to etch the topmost semiconductor material of the substrate. The spacers are then removed after each semiconductor fin has been formed.

One problem that is associated with forming semiconductor fins at tight pitch is that the process window for the cutting of the unwanted semiconductor fins is quite narrow. More specifically, the space available between fins at a tight pitch decreases the process window for placement of fin cut mask edge in between fins. One approach to address this issue is set forth in co-assigned U.S. Pat. No. 9,305,845 of Colburn et al., which discloses a self-aligned quadruple patterning (SAQP) process. While techniques of the Colburn patent have represented a substantial advance in the state of the art, nevertheless, in some instances, there are dummy fins that cannot be easily cleaned up because they are too close to adjacent active fins. U.S. Pat. No. 9,305,845 of Colburn et al. is hereby expressly incorporated herein by reference in its entirety for all purposes.

BRIEF SUMMARY

Embodiments of the present disclosure provide techniques for two-color self-aligned double patterning (SADP) to yield static random access memory (SRAM) and dense logic.

According to an embodiment of the present invention, an exemplary method includes providing a semiconductor structure having a generally planar surface; carrying out first lithography and etching on the semiconductor structure with a first mask, to provide a first intermediate semiconductor structure having a first set of surface features corresponding to a first portion of desired fin formation mandrels; and carrying out second lithography and etching on the first intermediate semiconductor structure, using a second mask, to provide a second intermediate semiconductor structure having a second set of surface features corresponding to a second portion of the desired fin formation mandrels, wherein the first set of surface features have a first pitch and wherein the second set of surface features have a second pitch and are unequally spaced from the first set of surface features. The method further includes forming the fin formation mandrels in the second intermediate semiconductor structure using the first and second sets of surface features; depositing spacer material over the fin formation mandrels and etching back the spacer material to form a third intermediate semiconductor structure having a fin pattern; and carrying out etching on the third intermediate semiconductor structure to produce desired fins corresponding to the fin pattern.

According to another embodiment of the present invention, another exemplary method includes providing a semiconductor structure having a generally planar surface; carrying out first lithography and etching on the semiconductor structure with a first mask, to provide a first intermediate semiconductor structure having a first set of surface features corresponding to a first portion of desired fin formation mandrels; and carrying out second lithography and etching on the first intermediate semiconductor structure, using a second mask, to provide a second intermediate semiconductor structure having a second set of surface features corresponding to a second portion of the desired fin formation mandrels. The first set of surface features have a first pitch and the second set of surface features have a second pitch different than the first pitch. Further steps include forming the fin formation mandrels in the second intermediate semiconductor structure using the first and second sets of surface features; depositing spacer material over the fin formation mandrels and etching back the spacer material to form a third intermediate semiconductor structure having a fin pattern; and carrying out etching on the third intermediate semiconductor structure to produce desired fins corresponding to the fin pattern.

Techniques of the present invention can provide substantial beneficial technical effects. For example, one or more embodiments reduce, or completely eliminate, undesirable formation of dummy fins, with manufacturing processes that can feasibly be implemented, and with finer fin pitch than can be achieved by conventional lithography.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
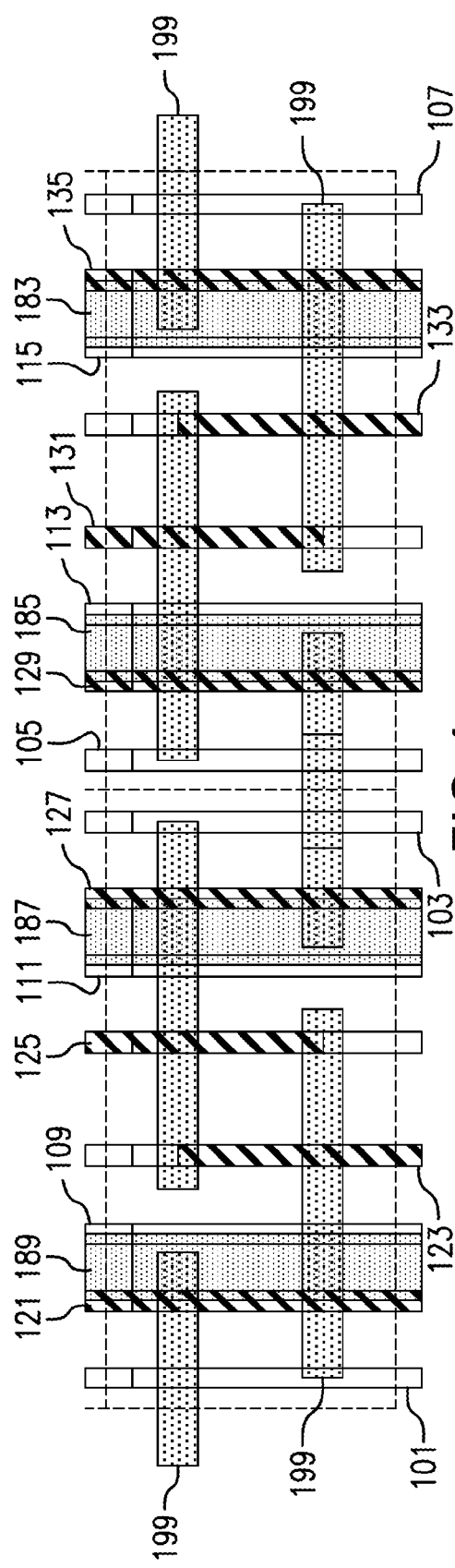
FIG. 1 is a plan view of an intermediate stage in semiconductor structure fabrication in accordance with the prior art, showing undesirable dummy fins.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of several illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

FIGS. 6-15 schematically illustrate several exemplary sequences of fabrication steps that may be employed in obtaining static random access memory (SRAM) and/or dense logic. Although the overall fabrication method is novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

In approaches using conventional SAQP, undesirable "dummy" fins are typically present, which will require Fin Cut mask and additional fabrication steps. However, with 2-color SADP, according to one or more embodiments, such "dummy" Fins can be avoided in the first instance and there is no need for a cut process; hence, further advantageous reductions in manufacturing process complexity, turn-around-time, and cost are anticipated.

SIT2 (sidewall image transfer twice)/SAQP (self-aligned quadruple patterning) has been the 'standard' solution to make refined fin pitch in scaled-down technology nodes. However, especially for static random access memory (SRAM) and dense logic with small devices of 1-2 fins with variable fin pitch, 'toxic' dummy FINI (dummy or inactive fins) are noted that cannot be cleaned up because they are too close to adjacent active FINA (active fins). Resist (RX) masking to remove dummy FINI in some instances cannot match the precision of the complex SIT2. Thus, the SAQP solution to refine FIN pitch may, in some circumstances, have pertinent issues.

One or more embodiments advantageously employ SIT1 (sidewall image transfer once)/SADP (Self-Aligned Double Patterning) for SRAM and dense logic. For logic using devices with more than two fins, one or more embodiments employ a two-color mandrel. There may be some possible penalty on the uniformity of the active FINA of the device because of the two color overlay in the same layout area. In addition, the device source-drain (S/D) capacitance may be slightly worse, or better, than prior techniques. This is because Fin pitch uniformity is an important factor for device performance. With 2 color SADP, meaning two mandrel lithography steps, the overlay could cause "pitch walking" (wherein the Fin-to-Fin distances are not equal) in the Fin structure. In other words, the pitches are not exactly the same in the final product. However, in the next generation lithography tool, such overlay effect can be minimized in real production. Note that one or more embodiments are particularly pertinent to "BIG" devices; e.g., more than two active fins and typically four or more active fins.

Figure 2:
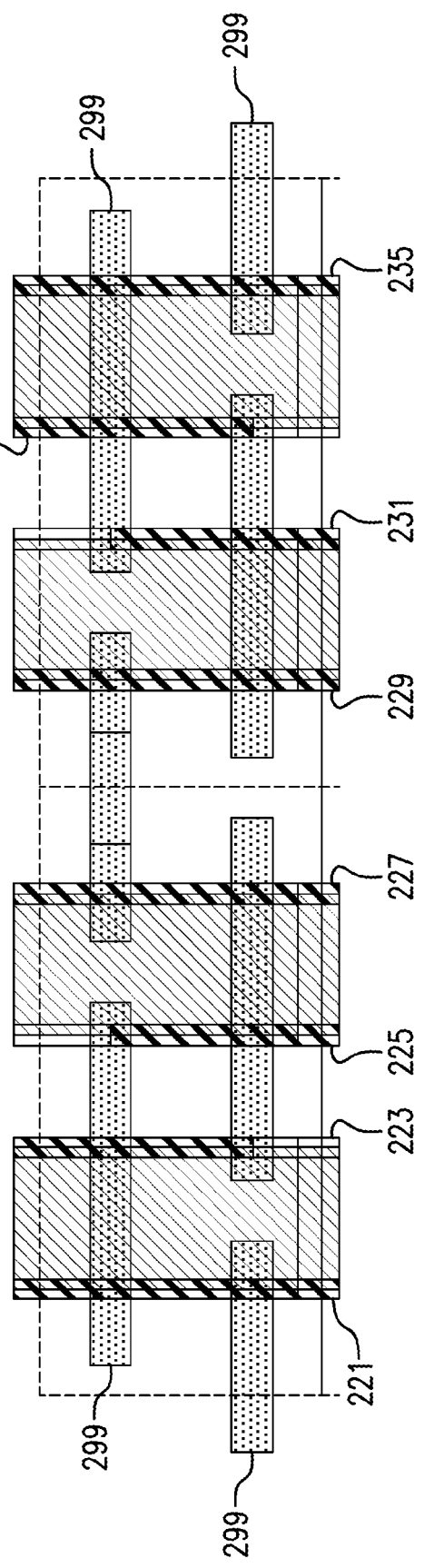
FIG. 2 is a plan view of a desired intermediate stage in semiconductor structure fabrication, showing how the structure of FIG. 1 would appear in an ideal case without dummy fin formation, which can be achieved in accordance with aspects of the invention.

Referring to FIG. 1, which is a top view of a prior art approach, note extreme variable fin pitch "squeeze" below 30 nm from SIT2 (SAQP), resulting in unavoidable dummy FINI that cannot be readily cleaned up. FIG. 2 shows a corresponding desired design. Note the undesirable inactive FINI 101, 103, 105, 107, 109, 111, 113, and 115 in FIG. 1 which are not present in the desired design shown in FIG. 2. The desirable, active fins are numbered 121, 123, 125, 127, 129, 131, 133, and 135. They correspond to fins 221, 223, 225, 227, 229, 231, 233, and 235 in the desired design of FIG. 2. The transverse structures 199, 299 represent gate or contact structures as will be apparent to the skilled artisan; to avoid clutter not all the transverse structures are numbered. In a non-limiting example, the fin widths can be 8 nm; the widths of the transverse structures can be 16 nm; the pitch of the transverse structures can be 56 nm; the center-line spacing of fins 221-223, 225-227, 229-231, and 233-235 can be 56 nm; the centerline spacing of fins 223-225 and 231-233 can be 48 nm; and the centerline spacing of fins 227-229 can be 76 nm. The corresponding fins in FIG. 1 can have similar spacings. The centerline spacing of the dummy fin 111 and active fin 127 can be 26 nm; the centerline spacing of the dummy fins 103-105 can be 24 nm; and the centerline spacing of the dummy fin 113 and active fin 129 can be 26 nm. In one or more embodiments, the desired design of FIG. 2 can be achieved using relaxed fin patterning in SIT1 (SADP) to make SRAM, without undesirable dummy FIN1 next to desired active FINA, and without the need for RX masking.

The regions 189, 187, 185, 183 represent sacrificial mandrel locations—reference is made to the aforementioned Colburn patent.

FIG. 1 is thus an example of a prior-art dense static random access memory (SRAM), with small devices of single active fin at variable mandrel pitch and fin pitch. In the prior art SAQP, fin pitch is squeezed below lithographic capability. The real active fins cannot be properly preserved. The dummy fins are too close to the single active fin and hence cannot be readily removed without potentially damaging the adjacent active fin.

Figure 3:
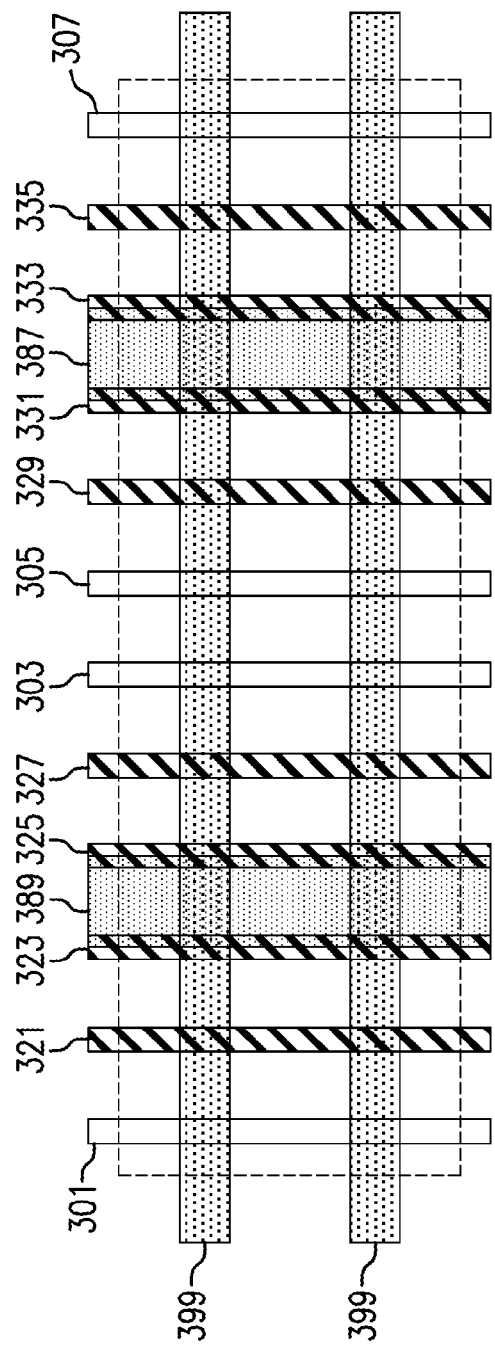
FIG. 3 is a plan view of another intermediate stage in semiconductor structure fabrication in accordance with the prior art, showing undesirable dummy fins.
Figure 4:
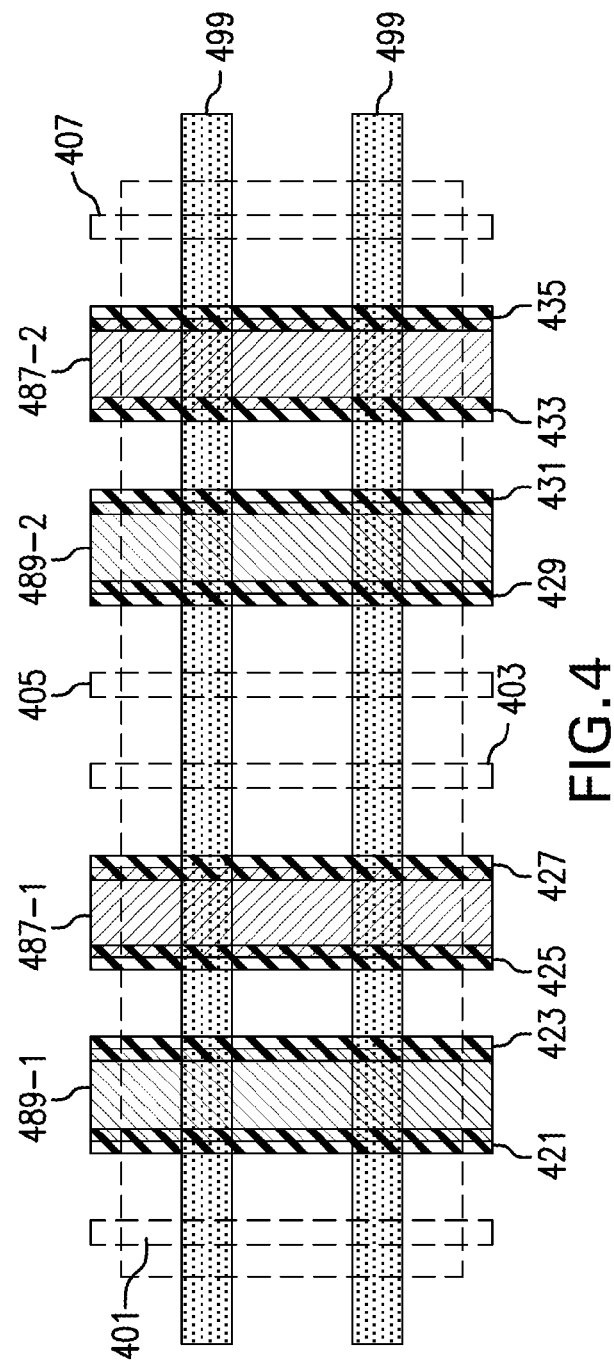
FIG. 4 is a plan view of an intermediate stage in semiconductor structure fabrication in accordance with an aspect of the invention, showing that undesirable dummy fins are not formed.

Referring now to FIGS. 3 and 4, FIG. 3 shows a prior art approach using SIT2 (SAQP) with a uniform fin pitch of 30 nm (e.g., 8 nm wide fins with 22 nm between the walls of the fins). The example of FIG. 3 is for a standard logic topology of four-fin devices; e.g., a dual inverter or an XOR gate. Extreme precision is necessary to remove the undesirable dummy fins. Furthermore in this regard, note dummy fins 301, 303, 305, 307 and desirable active fins 321, 323, 325, 327, 329, 331, 333, 335. Note also mandrels 389, 387 and transverse structures 399, which represent gate or contact structures as will be apparent to the skilled artisan. FIG. 4 shows a dual mandrel pattern for "BIG" devices in accordance with an aspect of the invention, wherein fabrication using a single pattern is not feasible. A mandrel pitch of 60 nm is employed with two colors. Advantageously, dummy fins do not form. A "pseudo-uniform" fin pitch of 30 is achieved. In some circumstances, an overlay (OL) of 6 nm can be used to "squeeze" a fin pitch of 30 nm down to a fin pitch of 24 nm. In particular note desirable active fins 421, 423, 425, 427, 429, 431, 433, 435. "Phantom" dummy fins 401, 403, 405, 407 are shown for reference; i.e., to show where dummy fins would have formed in the prior art process, but are not formed in this aspect. Note mandrels 489-1, 489-2 formed by the first exposure (first color)—see FIGS. 7 and 8 discussed below. Note also mandrels 487-1, 487-2 formed by the second exposure (second color)—see FIGS. 9 and 10 discussed below. Note also transverse structures 499, which represent gate or contact structures as will be apparent to the skilled artisan. The space between fins 421-423, 423-425, 425-427 and between fins 429-431, 431-433, and 433-435 can be, for example, 22 nm. The space between fins 427-429 can be, for example, 82 nm. The centerline distance between fins 427-429 can thus be 90 nm, while the centerline distance between fins 421-425 and 429-433 can thus be 60 nm.

The aforementioned "phantom" dummy fins thus suggest that the mandrel pattern is almost uniform for better lithographic control than a "random" non-uniform pattern. They indicate that the simpler new mandrel pattern is almost as uniform as the prior art for BIG logic devices with more than 2 fins. Hence, the cost to eliminate 'toxic' dummy fins with 2-color SADP is negligible. In at least some instances, this situation is not encountered for SRAM devices with 1-2 fins; such SRAM may not benefit from mandrel coloring, which is believed to be beneficial to refine BIG device FIN pitch. Thus, for low power chips with only small devices, conventional SADP without multicolor mandrel patterns may be appropriate.

Figure 5:
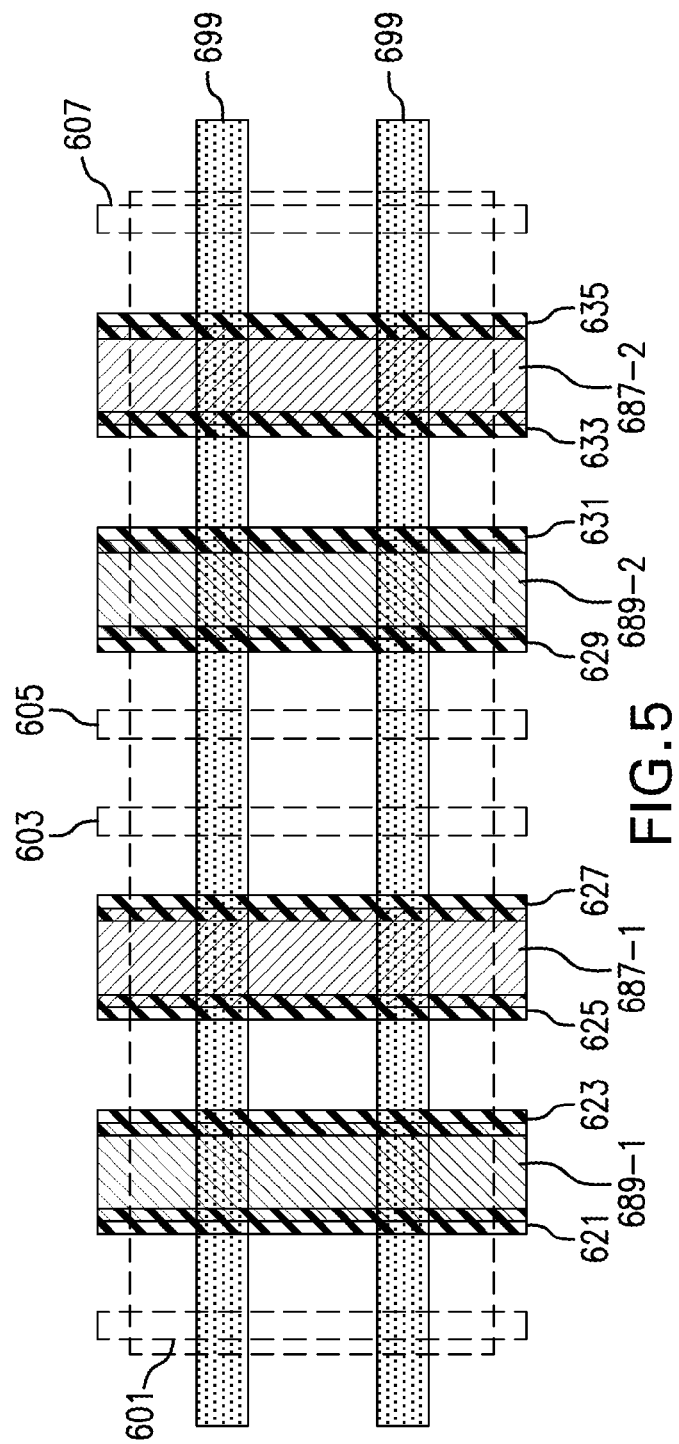
FIG. 5 is a plan view of an intermediate stage in semiconductor structure fabrication in accordance with an aspect of the invention, with variable mandrel spacing.

FIG. 5 shows how variable mandrel spacing can be used in one or more embodiments to avoid fin merging from off-specification overlay. Suppose, for example, the OL is about 10 nm. A source-drain capacitance penalty of about 9% may be observed; nevertheless, using such techniques dense SRAM can be obtained with in older lithographic machines. In particular note desirable active fins 621, 623, 625, 627, 629, 631, 633, 635. "Phantom" dummy fins 601, 603, 605, 607 are shown for reference; i.e., to show where dummy fins would have formed in the prior art process, but are not formed in this aspect. Note mandrels 689-1, 689-2 formed by the first exposure (first color)—see FIGS. 6 and 7 discussed below. Note also mandrels 687-1, 687-2 formed by the second exposure (second color)—see FIGS. 8 and 9 discussed below. Note also transverse structures 699, which represent gate or contact structures as will be apparent to the skilled artisan. The space between fins 621-623, 625-627 and between fins 629-631, and 633-635 can be, for example, 22 nm. The space between fins 627-629 can be, for example, 76 nm. The space between fins 623-625 and between fins 631-633 can be, for example, 28 nm. The centerline distance between fins 627-629 can thus be 84 nm, while the centerline distance between fins 621-625 and 629-633 can thus be 70 nm.

Further consider "BIG" logic devices with four active fins. SAQP can provide a uniform mandrel pitch and FIN pitch for "BIG" devices having four fins. FIG. 5 shows aspects of a 'less uniform' mandrel pitch and fin pitch in two-color SADP, which is mainly to eliminate toxic dummy fins. The possible cost is the 28 nm fin spacing between the two pairs of fins at fin pitch of 22 nm. The delta of 6 nm is mainly from equipment overlay spec, which will be refined with more expensive tools. That situation occurs if the foundry disallows variable fin pitch designs. If non-uniform pitch logic is used, as offered by, e.g., GlobalFoundries, Santa Clara, Calif., USA, then there is no penalty for this 2-color SADP scheme.

Thus, prior art techniques use only a single mask but carry out spacer deposition and etch twice. On the other hand, one or more embodiments use a first mask to provide a first set of mandrels and a second mask to provide a second set of mandrels, but carry out spacer deposition and (spacer) etch only once, without the need for dummy fin cutting/removal. Compare to Colburn U.S. Pat. No. 9,305,845 FIG. 20 showing fin 32 requiring removal as in Colburn U.S. Pat. No. 9,305,845 FIG. 21.

Figure 6:
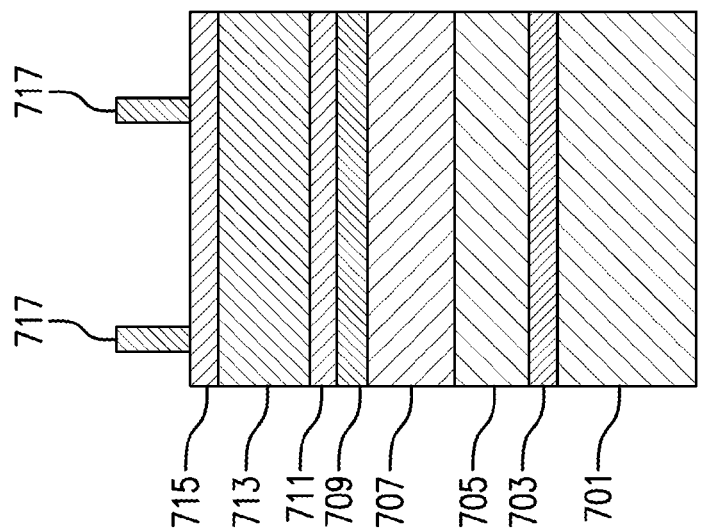

Referring now to FIGS. 6-15, as used herein, "two color" means the use of two different photo masks with two different patterns; the resists used in each step can be made of the same or different materials and can be sensitive to the same or different wavelengths of light. As is very well-known to the skilled artisan in the field of integrated circuit fabrication, photolithography uses light to transfer a geometric pattern from a photomask to a light-sensitive chemical "photoresist," or simply "resist," on the substrate. In FIG. 6, E1 (exposure 1) lithography is carried out using a first pattern on an initial semiconductor structure. The initial semiconductor structure includes substrate 701 (e.g., bulk silicon or silicon-on-insulator (SOI)); silicon nitride (SiN) layer 703; amorphous silicon (s-Si) layer 705; amorphous carbon (aC) layer 707; titanium oxide ("TiOx") layer 709; and oxide layer 711 (e.g. silicon oxide, $SiO_x$, a non-limiting example of which is silicon dioxide $SiO_2$). Outward of the oxide 711 are the organic planarization layer (OPL) 713 and hard mask (HM) 715. The first patterned photoresist (patterned with the first of the two masks) is numbered 717. Etching of the structure in FIG. 7, with stripping of the resist, results in the patterned oxide layer of FIG. 7 (E1 memory) with features 719, 721. Suitable materials for the hard mask 715 include $Ti_xO_y$, Si ARC (silicon containing anti-reflective coating layer), $SiO_x$, or SiNO (i.e. silicon oxynitride, a ceramic material with the chemical formula $SiO_xN_y$). Suitable materials for the OPL include spin-on-carbon (SoC) and ODL (commercially available from Shin-etsu Chemical, Co., Ltd. Tokyo, Japan).

Figure 7:
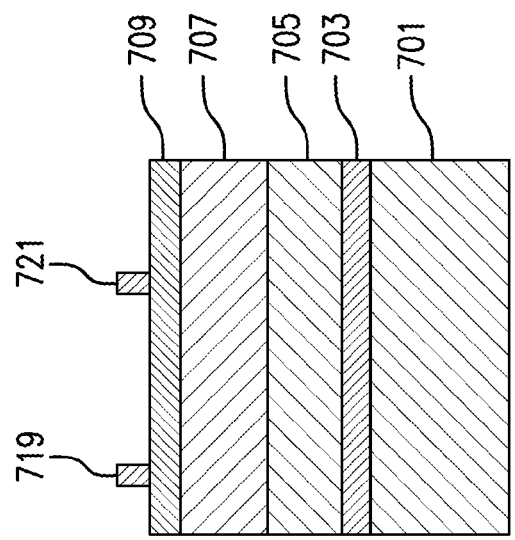
FIGS. 6 and 7 show a side cross-sectional view of a first color structure in accordance with an aspect of the invention post lithography and post etch respectively.
Figure 9:
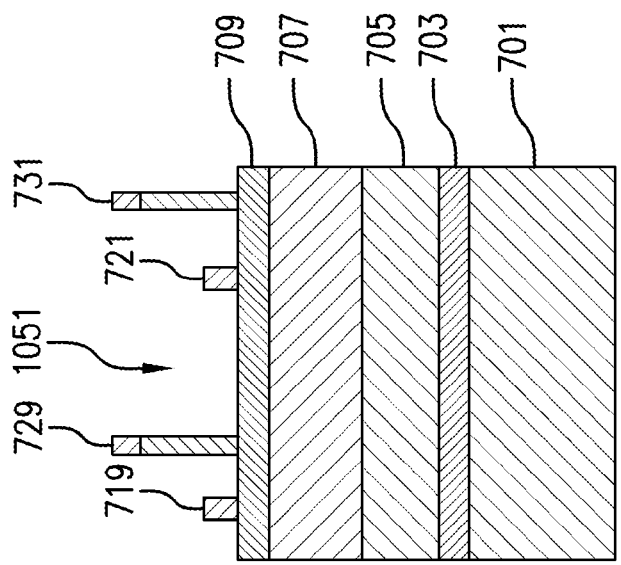
FIGS. 8 and 9 show a side cross-sectional view of a second color structure in accordance with an aspect of the invention post lithography and post etch respectively.
Figure 8:
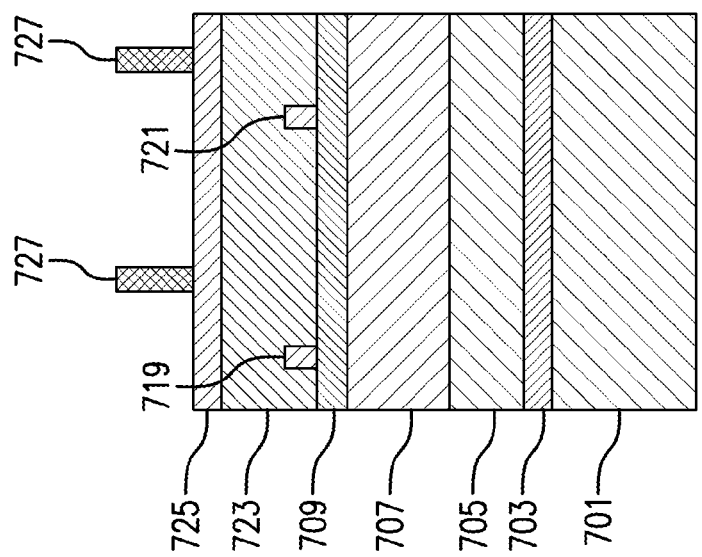
Figure 10:
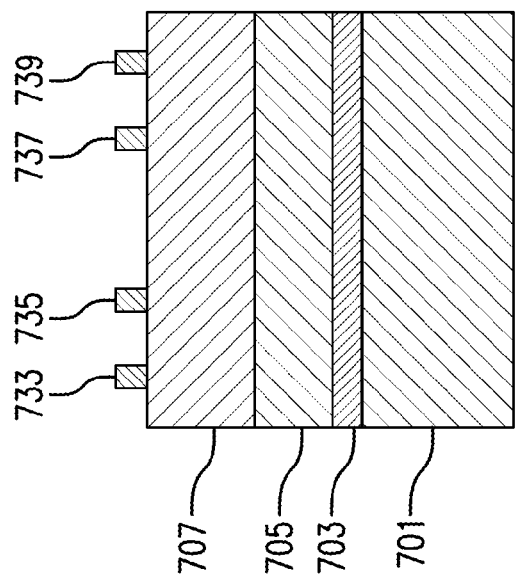
FIG. 10 shows etching of the structure of FIG. 9 to create features in a titanium oxide layer, in accordance with an aspect of the invention.

In FIG. 8, E2 (exposure 2) lithography is carried out using a second pattern. The second patterned photoresist (patterned with the second of the two masks) is numbered 727. Outward of the TiOx 709 and covering features 719, 721 are the organic planarization layer (OPL) 723 and hard mask (HM) 725. Etching of the structure in FIG. 8, with stripping of the resist 727, results in the second set of features 729, 731 (including OPL and hard mask), as seen in FIG. 9. Note that the distance between the adjacent features can be non-uniform; note the relatively large space 1051 between features 729, 721—this corresponds to a region where fins are not desired. It should be noted that this region would contain one or more "dummy" fins if attempting to fabricate using prior art techniques, but will not have any fins when fabricated using the techniques depicted in FIGS. 7-15. In FIG. 10, carry out further etching to produce the desired features corresponding to 719, 729, 721, 731 in the TiOx layer 709; the resultant features are numbered 733, 735, 737, 739.

Figure 11:
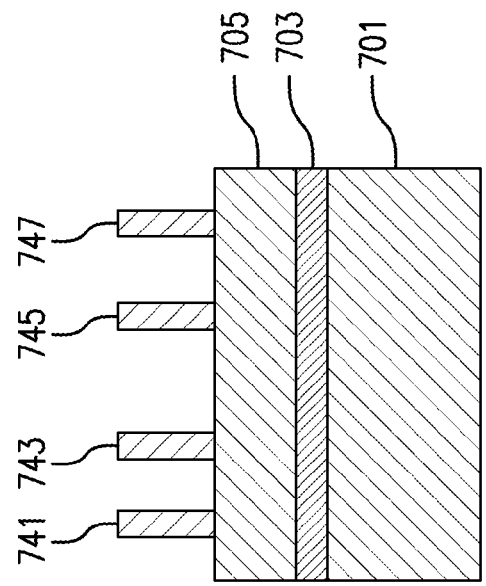
FIG. 11 shows etching of the structure of FIG. 10 to create mandrel features in an amorphous carbon layer, in accordance with an aspect of the invention.
Figure 13:
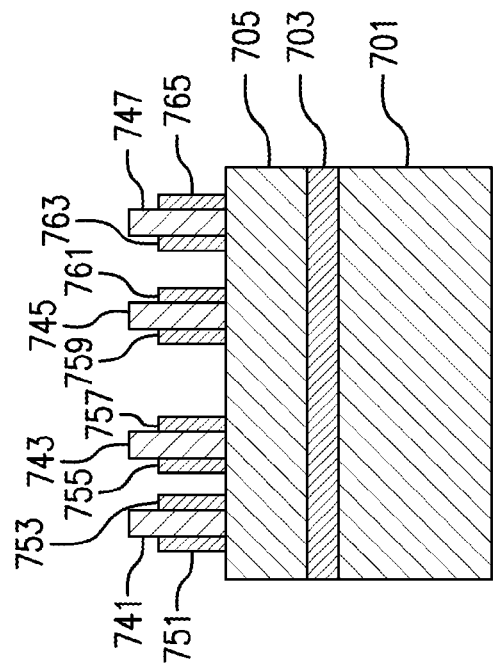
FIG. 13 shows the structure of FIG. 12 after top spacer etch-back, in accordance with an aspect of the invention.
Figure 12:
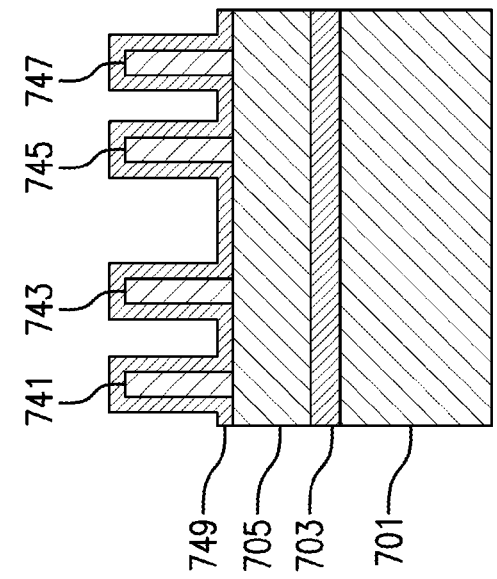
FIG. 12 shows top spacer deposition over the structure of FIG. 11, in accordance with an aspect of the invention.
Figure 15:
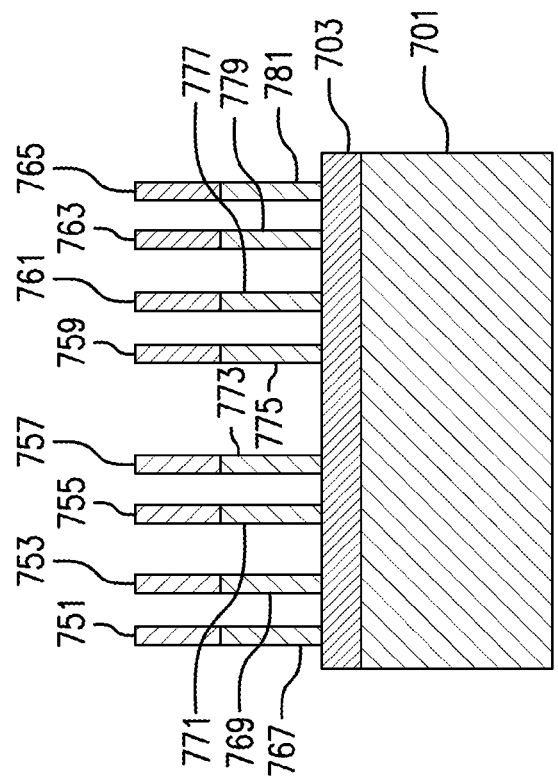
FIG. 15 shows the structure of FIG. 14 after BM (bottom mandrel) reactive ion etching (RIE) (enlarged view), in accordance with an aspect of the invention.
Figure 14:
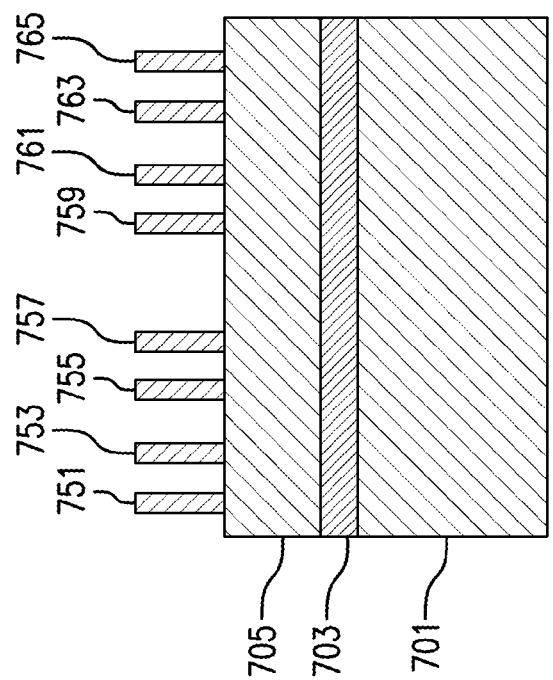
FIG. 14 shows the structure of FIG. 13 after mandrel pull (enlarged view), in accordance with an aspect of the invention.

In FIG. 11, etch to create mandrels 741, 743, 745, 747 in the amorphous carbon layer 707. In FIG. 12, carry out spacer deposition by depositing a suitable oxide layer 749 (e.g. silicon oxide, $SiO_x$, a non-limiting example of which is silicon dioxide $SiO_2$). In FIG. 13, etch back the layer 749 to produce spacer structures 751, 753; 755, 757; 759, 761; and 763, 765 extending partly up the sides of mandrels 741, 743, 745, 747 respectively. In FIG. 14, "pull" the mandrels leaving the spacers 751, 753; 755, 757; 759, 761; and 763, 765. In FIG. 15, carry out BM reactive ion etching (RIE) to create the fins 767, 769, 771, 773, 775, 777, 779, 781 in the amorphous Silicon (a-Si) layer 705. Processing then continues in a conventional manner to produce the gates and other conventional FinFET features.

It will be appreciated that some prior art techniques employ SAQP mandrel side wall merge to annul dummy fins, which entails extra process steps and layout constraints, while other prior art techniques employ composite SAQP and SADP for "BIG" devices and dense devices. This latter approach involves extreme process complexity, and dummy fin removal in SAQP remains challenging.

Figure 16:
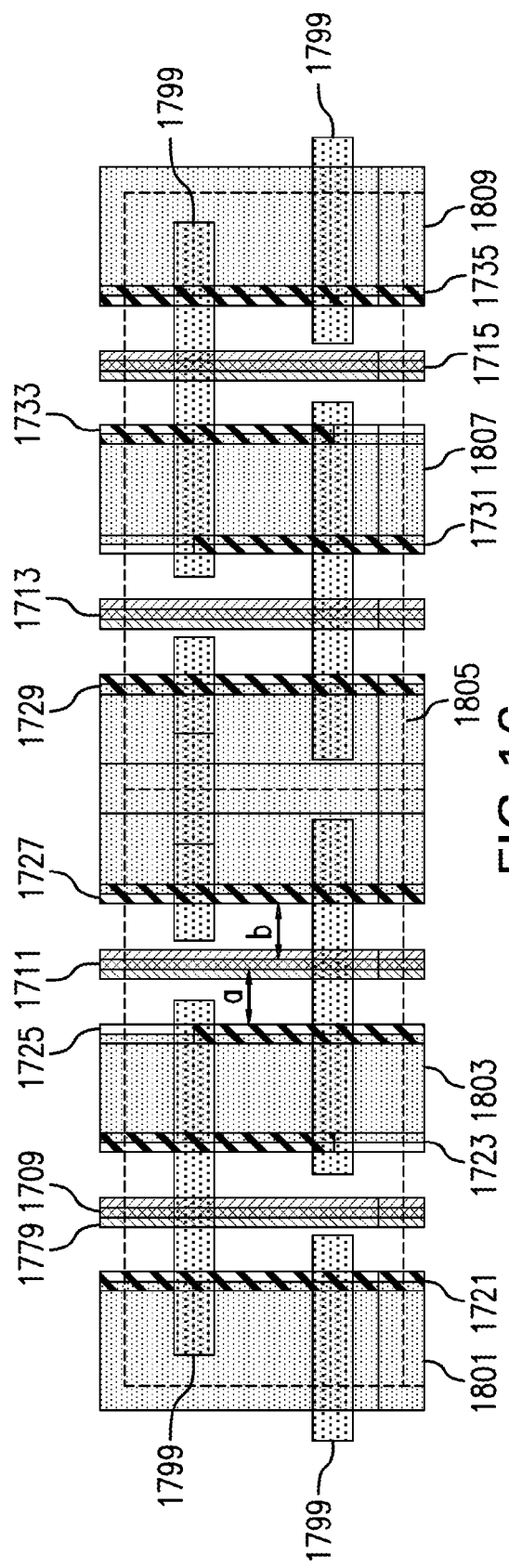
FIG. 16 shows a plan view of a sidewall merge approach in accordance with the prior art.

Referring to FIG. 16, a point-of-reference process is depicted providing a partial solution with side wall merge, useful if a bigger device with more than two active fins must be provided. The desirable, active fins are numbered 1721, 1723, 1725, 1727, 1729, 1731, 1733, and 1735. The transverse structures 1799 represent gate or contact structures as will be apparent to the skilled artisan; to avoid clutter not all the transverse structures are numbered. In a non-limiting example, the fin widths can be 8 nm; the widths of the transverse structures can be 16 nm; and the pitch of the transverse structures can be 56 nm. The centerline spacing of the dummy fin 1711 and active fin 1727 can be 26 nm; and the centerline spacing of the dummy fin 1713 and active fin 1729 can be 26 nm. FIG. 16 shows a partial solution using current techniques, using sidewall merge to virtually remove two dummy fins—virtual dummy fin elimination via a first sidewall merge is shown at 1779 (corresponding dummy fin is 1709 and see similar merge at dummy fin 1715). Fin-to-fin spacing here (e.g. 1725 and 1727) is 56 nm on center, with a nominal sidewall overlap of 4 nm. The "overlap 4" merging may be unpredictable unless the layout is compromised. The dimensions "a" and "b" can be 22 nm. All dimensions herein are exemplary and non-limiting, unless recited in the claims. FIG. 16 thus depicts a prior art solution to remove 'toxic' dummy fins from the second side wall of SAQP with first side wall merge.

The regions 1801, 1803, 1805, 1807, 1809 represent mandrels—reference is made to the aforementioned Colburn patent.

One or more embodiments thus provide finer-pitched fins than are available with conventional lithography, but do not produce undesirable dummy fins that are difficult to remove.

It will be appreciated that materials other than those described herein can be employed in two-color self-aligned double patterning (SADP) to yield static random access memory (SRAM) and/or dense logic.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method is novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary method, according to an aspect of the invention, includes the step of providing a semiconductor structure having a generally planar surface (e.g., elements 701, 703, 705, 707, 709, 711 in FIG. 6). An additional step includes carrying out first lithography and etching on the semiconductor structure with a first mask, to provide a first intermediate semiconductor structure having a first set of surface features 719, 721 corresponding to a first portion of desired fin formation mandrels. For example, use E1 litho to obtain the first intermediate structure of FIG. 7 from FIG. 6—note that FIG. 6 shows first lithography to define 1$^{st}$ SADP mandrel, while FIG. 7 is post-etch (e.g., RIE) to memorize the 1$^{st}$ mandrel structure. A further step includes carrying out second lithography and etching on the first intermediate semiconductor structure, using a second mask, to provide a second intermediate semiconductor structure having a second set of surface features corresponding to a second portion of the desired fin formation mandrels. The first set of surface features have a first pitch and the second set of surface features have a second pitch. The second set of features is unequally spaced from the first set of surface features. For example, use E2 litho in FIG. 8 to obtain the FIG. 9 second intermediate structure from the first intermediate structure of FIG. 7.

In a non-limiting example, to create a region with no dummy fins, the 2$^{nd}$ lithography pattern location is adjusted referring to the 1$^{st}$ pattern. The pitch in E1 and E2 can be the same or can be different. There can be offset between E1 and E2 as well. The designer will accordingly have a lot of flexibility to avoid dummy fins even being formed, as compared to certain prior-art SAQP techniques. In some cases, the feature pitch is the same in both masks but E1 and E2 are offset such that the final features (FIG. 9) are not spaced equidistantly, leaving fin-free gap 1051 where desired.

Still a further step includes forming the fin formation mandrels in the second intermediate semiconductor structure using the first and second sets of surface features. See FIGS. 10 and 11, which show both E1 and E2 mandrel structures memorized (FIG. 10) and transferred (FIG. 11) to the underneath hard mask layer 707. An even further step includes depositing spacer material 749 (FIG. 12) over the fin formation mandrels and etching back the spacer material (FIG. 13) to form a third intermediate semiconductor structure having a fin pattern (FIG. 14: 751, 753, 755, 757, 759, 761, 763, 765). FIG. 12 is post spacer deposition, forming conformal coating around all the E1 and E2 mandrel structures; FIG. 13 is post spacer open. Note: only the top and bottom are removed in an-isotropic etch. One the sides, all film/coating still remains. FIG. 14 is post E1 E2 mandrel pull.

Yet a further step includes carrying out etching on the third intermediate semiconductor structure to produce desired fins 767, 769, 771, 773, 775, 777, 779, 781 corresponding to the fin pattern. In cases with a fin-free region (between 773 and 775), the same is free of fins. Thus, one or more embodiments use oxide as a mask to etch the Si material, forming final fin structure/patterns.

Figure 17:
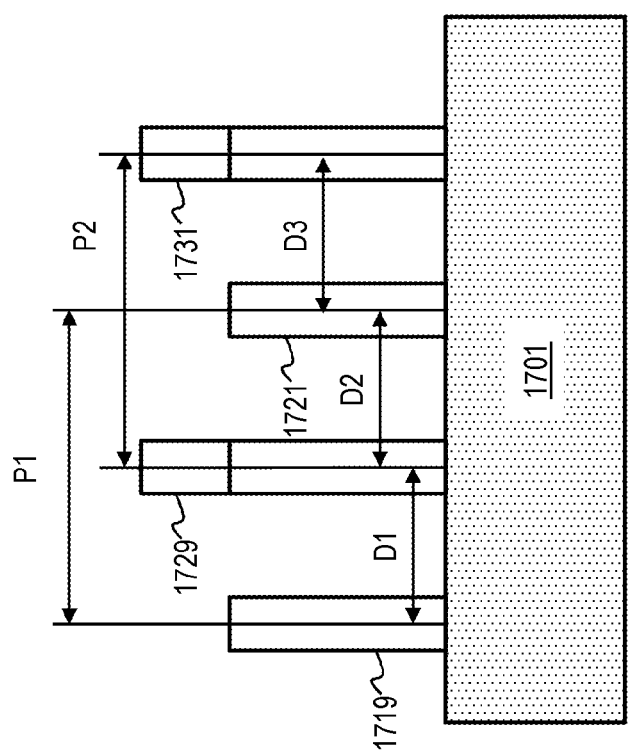
FIGS. 17 and 18 show exemplary dimensions), in accordance with aspects of the invention.

In one or more embodiments, in the step of carrying out the second lithography and etching, the first and second pitches are equal and the first set of surface features and the second set of surface features are interleaved. Refer to FIG. 9 and now also FIG. 17. In FIG. 17, elements 1719, 1729, 1721, and 1731 are analogous to elements 719, 721, 729, 731 in FIG. 9. Element 1701 is a generalized representation of, for example, layers 701-709. D1 is the centerline spacing between 1719 and 1729; D2 is the centerline spacing between 1729 and 1721; and D3 is the centerline spacing between 1721 and 1731. P1 is the first color pitch and P2 is the second color pitch. The features are interleaved; i.e., features from color 2 are in between features from color 1.

In some cases, as best seen in FIGS. 9 and 17, the second set of surface features are adjusted with respect to the first set of surface features by less than half the first pitch (D1 is less than half P1) to create the fin-free region 1051. That is to say, feature 729 is not equidistant features 719 and 721 but is closer to 719, to create region 1051 (D1>D2). The D1 and D3 nomenclature could be interchanged, in effect, by looking at the structure from the other side, i.e., looking out of the plane of the paper.

In one or more embodiments, when the etching is carried out on the third intermediate semiconductor structure to produce the desired fins corresponding to the fin pattern, wherein the fin-free region is free of fins, a space between fins defining the fin-free region (e.g. between 773 and 775) is larger than a space between adjacent fins in the fin pattern (e.g. between 767/769 and 769/771).

Advantageously, in one or more embodiments, the method steps are performed without any additional mandrel sidewall spacer deposition (i.e., other than that of FIG. 12).

Advantageously, in one or more embodiments, the method steps are performed without any cutting of dummy fins. The dummy fins effectively "disappear" in the final product with variable pitches design in E1 and E2, and offset between E1 and E2.

In one or more embodiments, the semiconductor structure having the generally planar surface includes an amorphous silicon layer 705 in which the fin pattern is formed in the step of carrying out etching on the third intermediate semiconductor structure.

Furthermore, in one or more embodiments, the semiconductor structure having the generally planar surface further includes an amorphous carbon layer 707 outside the amorphous silicon layer, wherein the fin formation mandrels are formed in the amorphous carbon layer.

The step of carrying out etching on the third intermediate semiconductor structure to produce the desired fins corresponding to the fin pattern can include, for example, carrying out reactive ion etching (RIE).

Figure 18:
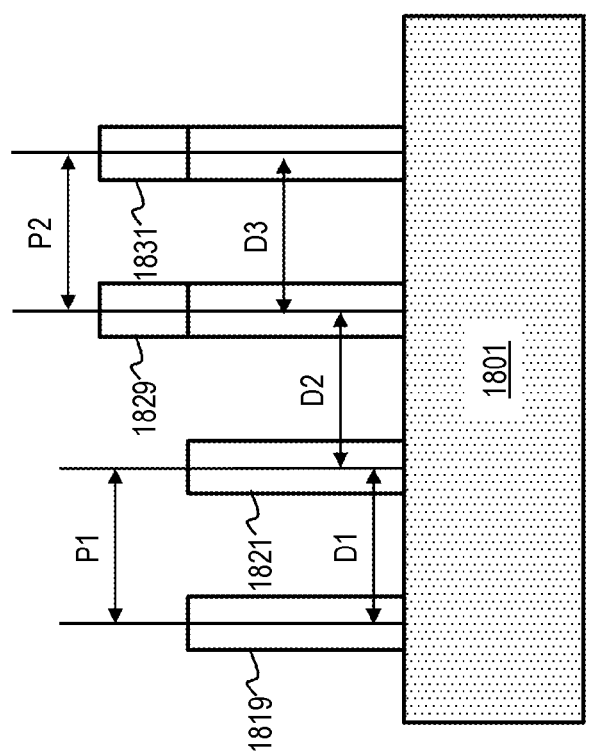

In some cases, in the step of carrying out the second lithography and etching, the first set of surface features and the second set of surface features are not interleaved, as best seen in FIG. 18. In FIG. 18, elements 1819, 1829, 1821, and 1831 are analogous to elements 719, 721, 729, 731 in FIG. 9. Element 1801 is a generalized representation of, for example, layers 701-709. D1 is the centerline spacing between 1819 and 1821; D2 is the centerline spacing between 1821 and 11829; and D3 is the centerline spacing between 11829 and 1831. P1 is the first color pitch and P2 is the second color pitch. The features are not interleaved; i.e., features from color 2 are adjacent each other and not in between features from color 1.

In another aspect, another exemplary method, according to another aspect of the invention, includes the step of providing a semiconductor structure having a generally planar surface (e.g., elements 701, 703, 705, 707, 709, 711 in FIG. 6). An additional step includes carrying out first lithography and etching on the semiconductor structure with a first mask, to provide a first intermediate semiconductor structure having a first set of surface features 719, 721 corresponding to a first portion of desired fin formation mandrels. For example, use E1 litho to obtain the first intermediate structure of FIG. 7 from FIG. 6—note that FIG. 6 shows first lithography to define 1st SADP mandrel, while FIG. 7 is post-etch (e.g., RIE) to memorize the 1st mandrel structure. A further step includes carrying out second lithography and etching on the first intermediate semiconductor structure, using a second mask, to provide a second intermediate semiconductor structure having a second set of surface features corresponding to a second portion of the desired fin formation mandrels. The first set of surface features have a first pitch and the second set of surface features have a second pitch different than the first pitch; i.e., referring to FIGS. 17 and 18, P1≠P2. For example, use E2 litho in FIG. 8 to obtain the FIG. 9 second intermediate structure from the first intermediate structure of FIG. 7.

Still a further step includes forming the fin formation mandrels in the second intermediate semiconductor structure using the first and second sets of surface features. See FIGS. 10 and 11, which show both E1 and E2 mandrel structures memorized (FIG. 10) and transferred (FIG. 11) to the underneath hard mask layer 707. An even further step includes depositing spacer material 749 (FIG. 12) over the fin formation mandrels and etching back the spacer material (FIG. 13) to form a third intermediate semiconductor structure having a fin pattern (FIG. 14: 751, 753, 755, 757, 759, 761, 763, 765). FIG. 12 is post spacer deposition, forming conformal coating around all the E1 and E2 mandrel structures; FIG. 13 is post spacer open. Note: only the top and bottom are removed in an-isotropic etch. One the sides, all film/coating still remains. FIG. 14 is post E1 E2 mandrel pull.

One or more embodiments thus advantageously provide techniques for circuit layout design which permit manufacturing desired semiconductor circuit structures easily and cleanly with good control, which is not available from the leading edge SAQP process. Furthermore, one or more embodiments provide techniques to make dense custom circuit layouts. General layout ground rules written to handle 'standard' logic circuits tend to rule out circuit density which is actually possible from the workable process.

Yet a further step includes carrying out etching on the third intermediate semiconductor structure to produce desired fins 767, 769, 771, 773, 775, 777, 779, 781 corresponding to the fin pattern.

Advantageously, in one or more embodiments, the method steps are performed without any additional mandrel sidewall spacer deposition (i.e., other than that of FIG. 12).

Advantageously, in one or more embodiments, the method steps are performed without any cutting of dummy fins.

In one or more embodiments, the semiconductor structure having the generally planar surface includes an amorphous silicon layer 705 in which the fin pattern is formed in the step of carrying out etching on the third intermediate semiconductor structure.

Furthermore, in one or more embodiments, the semiconductor structure having the generally planar surface further includes an amorphous carbon layer 707 outside the amorphous silicon layer, wherein the fin formation mandrels are formed in the amorphous carbon layer.

The step of carrying out etching on the third intermediate semiconductor structure to produce the desired fins corresponding to the fin pattern can include, for example, carrying out reactive ion etching (RIE).

Referring again to FIG. 17, P1 and P2 are mainly from the mandrel width, which can be much smaller relative to the mandrel pitch itself. To generate uniform fin pitch as in conventional SAQP, the layout design condition is: P1=P2, D1=D3=D2.

As long as P1=P2, two of the three fin spacings are the same, or D1=D3. D2 may in some cases deviate from D1 and D3 due to overlay variation of the 2nd exposure relative to the 1st exposure. Overlay variation with advanced lithography tooling is getting negligible relative to D1 and D3.

Gain is advantageously quite pronounced for variable fin pitch designs.

In some cases, D2 can be even smaller than D1 and D3 with advanced litho tooling, allowing extra local refinement of fin pitch. For multiple fin devices, smaller fin pitch is desired to cut down the source-drain capacitance. Thus, in some cases, in the step of carrying out the second lithography and etching, the first and second pitches are equal, the first set of surface features and the second set of surface features are interleaved, and the second set of surface features are adjusted with respect to the first set of surface features by more than half the first pitch to locally reduce fin pitch.

For 2 fin devices that have to be far apart for some global wiring, D2 can be set to >>D1 and D3, with no dummy fins in between. This removes the prior art overhead of fin cut.

P2 can also be drawn different from P1 for various circuit layout optimizations.

Two-color SADP is especially advantageous to allow scaling of dense circuits like SRAM, where unavoidable dummy fins cannot be trimmed without damaging the adjacent active fins.

It is believed that the D2 deviation from SAQP is actually no better or even worse than the D2 deviation from overlay of 2-color SADP. Heretofore it may have been assumed that hard mask FIN pitch from the mandrel sidewalls is precise; however, this may have neglected the difficult aspect of controlling of the mandrel sidewall spacing that must be equal to the sidewall thickness in some prior-art aspects. Thus, the D2 deviation of SAQP may be worse in some instances than the D2 deviation from 2-color overlay.

In conventional SAQP, if it is needed for D2 to be variable, then P needs to be different pitch in the fin level, which is not doable, inasmuch as 1) no good illumination can support variable Fin pitch, if so, 2) the critical dimension uniformity (CDU) will be very high. Current approaches typically employ single Fin pitch, aka P=constant; D2 has to equal D1 and D3, for SAQP. One or more embodiments advantageously overcome these limitations.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of forming a static random access memory (SRAM) region, the method comprising:
   providing (i) a first set of mandrels corresponding to a first lithography process and (ii) a second set of mandrels corresponding to a second lithography process, wherein a first mandrel of the first set of mandrels is adjacent to a first mandrel of the second set of mandrels;
   forming spacers on the first and second sets of mandrels within approximately a same time interval during which a spacer layer deposition and etch process occurs; and
   removing the first and second sets of mandrels to form an intermediate SRAM fin pattern, the intermediate SRAM fin pattern comprising:
   first and second intermediate SRAM fins corresponding to spacers on opposing sidewalls of the first mandrel of the first set of mandrels; and
   third and fourth intermediate SRAM fins corresponding to spacers on opposing sidewalls of the first mandrel of the second set of mandrels, wherein the second and third intermediate SRAM fins are adjacent intermediate SRAM fins,
   wherein a pitch between the third and fourth intermediate SRAM fins corresponds to a width of the first mandrel of the second set of mandrels plus a width of a spacer, and
   wherein a pitch between the second and third intermediate SRAM fins corresponds to a width of a space between the first mandrel of the first set of mandrels and the first mandrel of the second set of mandrels minus the width of a spacer.

2. The method of claim 1, further comprising etching to transfer the intermediate SRAM fin pattern into a substrate to form first, second, third, and fourth active SRAM fins.

3. The method of claim 2, wherein forming the first, second, third, and fourth active SRAM fins involves only one spacer layer deposition and etch.

4. The method of claim 2, further comprising removing a portion of the third active SRAM fin.

5. The method of claim 2, further comprising removing a portion of the second and third active SRAM fins.

6. The method of claim 2, wherein a centerline spacing of the second and third active SRAM fins is approximately 48 nm.

7. The method of claim 2, wherein a centerline spacing of the third and fourth active SRAM fins is approximately 56 nm.

8. The method of claim 1, wherein the first set of mandrels comprises a second mandrel of the first set of mandrels, the method further comprising:

forming fifth and sixth intermediate SRAM fins corresponding to spacers on opposing sidewalls of the second mandrel of the first set of mandrels,
wherein the third and fourth intermediate SRAM fins are between (i) the first and second intermediate SRAM fins and (ii) the fifth and sixth intermediate SRAM fins, and
wherein the intermediate SRAM fin pattern further comprises the fifth and sixth intermediate SRAM fins.

9. The method of claim 8, further comprising etching to transfer the intermediate SRAM fin pattern into a substrate to form first, second, third, fourth, fifth, and sixth active SRAM fins.

10. The method of claim 9, wherein forming the first, second, third, fourth, fifth, and sixth active SRAM fins involves only one spacer layer deposition and etch.

11. A method of forming a static random access memory (SRAM) region, the method comprising:
providing (i) a first set of mandrels corresponding to a first lithography process and (ii) a second set of mandrels corresponding to a second lithography process, wherein a first mandrel of the first set of mandrels is adjacent to a first mandrel of the second set of mandrels, and wherein the first and second set of mandrels are interleaved;
forming spacers on the first and second sets of mandrels within approximately a same time interval during which a spacer layer deposition and etch process occurs; and
removing the first and second sets of mandrels to form an intermediate SRAM fin pattern, the intermediate SRAM fin pattern comprising:
first and second intermediate SRAM fins corresponding to spacers on opposing sidewalls of the first mandrel of the first set of mandrels; and
third and fourth intermediate SRAM fins corresponding to spacers on opposing sidewalls of the first mandrel of the second set of mandrels, wherein the second and third intermediate SRAM fins are adjacent intermediate SRAM fins,
wherein a pitch between the third and fourth intermediate SRAM fins corresponds to a width of the first mandrel of the second set of mandrels plus a width of a spacer, and
wherein a pitch between the second and third intermediate SRAM fins corresponds to a width of a space between the first mandrel of the first set of mandrels and the first mandrel of the second set of mandrels minus the width of a spacer.

12. The method of claim 11, further comprising etching to transfer the intermediate SRAM fin pattern into a substrate to form first, second, third, and fourth active SRAM fins.

13. The method of claim 12, wherein forming the first, second, third and fourth active SRAM fins involves only one spacer layer deposition and etch.

14. The method of claim 12, further comprising removing a portion of the third active SRAM fin.

15. The method of claim 12, further comprising removing a portion of the second and third active SRAM fins.

16. The method of claim 11, wherein the first set of mandrels comprises a second mandrel of the first set of mandrels, and wherein the second set of mandrels comprises a second mandrel of the second set of mandrels, the method further comprising:
forming fifth and sixth intermediate SRAM fins corresponding to spacers on opposing sidewalls of the second mandrel of the first set of mandrels; and
forming a seventh and an eighth intermediate SRAM fin corresponding to spacers on opposing sidewalls of the second mandrel of the second set of mandrels,
wherein the third and fourth intermediate SRAM fins are between (i) the first and second intermediate SRAM fins and (ii) the fifth and sixth intermediate SRAM fins,
wherein the fifth and sixth intermediate SRAM fins are between (i) the third and fourth intermediate SRAM fins and (ii) the seventh and eighth intermediate SRAM fins,
wherein the sixth intermediate SRAM fin is adjacent to the seventh intermediate SRAM fin, and
wherein the intermediate SRAM fin pattern further comprises the fifth, sixth, seventh, and eighth intermediate SRAM fins.

17. The method of claim 16, further comprising etching to transfer the intermediate SRAM fin pattern into a substrate to form first, second, third, fourth, fifth, sixth, seventh, and eighth active SRAM fins.

18. The method of claim 17, wherein forming the first, second, third, fourth, fifth, sixth, seventh, and eighth active SRAM fins involves only one spacer layer deposition and etch.

19. The method of claim 16, wherein:
a pitch between the seventh and eighth intermediate SRAM fins corresponds to a width of the second mandrel of the second set of mandrels plus the width of a spacer; and
a pitch between the sixth and seventh intermediate SRAM fins corresponds to a width of the space between the second mandrel of the first set of mandrels and the second mandrel of the second set of mandrels minus the width of a spacer.

20. The method of claim 16, wherein the pitch between the first and second mandrels of the first set of mandrels is equal to the pitch between the first and second mandrels of the second set of mandrels.

* * * * *